United States Patent
Park et al.

(10) Patent No.: US 9,774,766 B2
(45) Date of Patent: Sep. 26, 2017

(54) STATIC ELECTRICITY DISCHARGE STRUCTURE FOR CAMERA DEVICE

(71) Applicant: Samsung Electronics Co., Ltd., Suwon-si (KR)

(72) Inventors: Min-Ki Park, Seoul (KR); Jae-Han Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 14/737,059

(22) Filed: Jun. 11, 2015

(65) Prior Publication Data

US 2015/0366110 A1    Dec. 17, 2015

(30) Foreign Application Priority Data

Jun. 11, 2014 (KR) ................... 10-2014-0071105

(51) Int. Cl.
*H04N 5/225* (2006.01)
*H05K 9/00* (2006.01)
*H04M 1/02* (2006.01)

(52) U.S. Cl.
CPC ........ *H04N 5/2252* (2013.01); *H04M 1/0264* (2013.01); *H04N 5/2257* (2013.01); *H05K 9/0067* (2013.01)

(58) Field of Classification Search
CPC .... H04N 5/225; H04N 5/2252; H04N 5/2253; H04M 1/0264; H05K 5/0067
See application file for complete search history.

(56) References Cited

U.S. PATENT DOCUMENTS

| | | |
|---|---|---|
| 5,759,428 A | 6/1998 | Balamane et al. |
| 6,049,056 A | 4/2000 | Balamane et al. |
| 6,315,609 B1 | 11/2001 | Chung |
| 6,469,536 B1 | 10/2002 | Kessler et al. |
| 2004/0189847 A1 | 9/2004 | Hogrebe et al. |
| 2004/0230707 A1 | 11/2004 | Stavely et al. |
| 2004/0239794 A1* | 12/2004 | Saito ............. G02B 7/022 348/340 |
| 2006/0007350 A1 | 1/2006 | Gao et al. |
| 2007/0032260 A1* | 2/2007 | Kim .............. H04M 1/0264 455/550.1 |
| 2008/0020813 A1* | 1/2008 | Choi ............. H04B 1/3833 455/575.3 |
| 2008/0064321 A1 | 3/2008 | Huang et al. |
| 2008/0143871 A1* | 6/2008 | Go ................ H04N 5/2257 348/374 |
| 2009/0279219 A1 | 11/2009 | Yu |
| 2010/0246152 A1 | 9/2010 | Lin et al. |

(Continued)

FOREIGN PATENT DOCUMENTS

KR    10-20070000535 A    1/2007

*Primary Examiner* — Abdelaaziz Tissire

(57) ABSTRACT

According to various embodiments of the present disclosure, a camera device comprises a camera housing where a camera assembly is mounted; a decoration part covering the camera housing; and a fixing part provided along a periphery of the camera housing and fixing the decoration part, wherein the fixing part includes a path part along which static electricity introduced through the decoration part moves a discharge module mounted adjacent to the camera housing. Various other embodiments are possible as well.

27 Claims, 7 Drawing Sheets

(56) References Cited

U.S. PATENT DOCUMENTS

| | | | |
|---|---|---|---|
| 2011/0310248 A1* | 12/2011 | McElroy | H04N 5/2254 |
| | | | 348/148 |
| 2013/0002273 A1 | 1/2013 | Min et al. | |
| 2013/0242500 A1 | 9/2013 | Lin et al. | |
| 2013/0250504 A1* | 9/2013 | Choi | G06F 1/203 |
| | | | 361/679.26 |
| 2014/0160324 A1* | 6/2014 | Kim | H04N 5/2257 |
| | | | 348/250 |
| 2014/0293558 A1* | 10/2014 | Lim | H05K 1/0215 |
| | | | 361/760 |
| 2014/0313403 A1* | 10/2014 | Chen | H04N 5/2252 |
| | | | 348/373 |
| 2015/0015779 A1* | 1/2015 | Duan | H04N 5/2253 |
| | | | 348/374 |

\* cited by examiner

STATIC ELECTRICITY DISCHARGE STRUCTURE FOR CAMERA DEVICE

CROSS-REFERENCE TO RELATED APPLICATION(S) AND CLAIM OF PRIORITY

The present application is related to and claims the benefit under 35 U.S.C. §119(a) of a Korean patent application filed in the Korean Intellectual Property Office on Jun. 11, 2014 and assigned Serial No. 10-2014-0071105, the entire disclosure of which is incorporated herein by reference.

TECHNICAL FIELD

The present disclosure relates to an electronic device, for example, an electronic device with a camera device that discharges static electricity.

BACKGROUND

Electronic device means a device performing a particular function according to its equipped program, such as a home appliance, an electronic scheduler, a portable multimedia player, a mobile communication terminal, a tablet PC, a video or sound device, a desktop PC or laptop computer, a navigation system for an automobile, etc. Recently, a mobile communication terminal or other electronic device tends to be equipped with various functions. For example, among portable electronic devices, the mobile communication terminal come with the integrated capabilities, including an entertainment function, such as playing video games, a multimedia function, such as replaying music or videos, a communication and security function for mobile banking, and a scheduling or e-wallet function.

Various modules are mounted in an electronic device. Camera lens assemblies (hereinafter, "camera modules" or "camera devices") with parts being commercialized, which takes a picture or video.

As described above, a camera device mounted in a portable or compact electronic device is included at an inner side of the electronic device to be exposed to the surface of the electronic device. The camera device should have a structure to be opened at the surface of the electronic device. When the camera device is opened in structure at the surface of the electronic device, a metallic decoration is mounted for a diversified or gorgeous design. For example, the metallic decoration is fixed around the periphery of the camera device to be positioned between the camera device and the mounted surface of the electronic device.

However, when static electricity arises around the electronic device, the static electricity can flow to the inside of the camera device through the metallic decoration. The inflow of the static electricity to the camera device through the metallic device damages or causes a malfunction of the camera device and further influences other modules in the electronic device causing various errors in the modules, such as damages, breaks, or malfunctions.

The above information is presented as background information only to assist with an understanding of the present disclosure. No determination has been made, and no assertion is made, as to whether any of the above might be applicable as prior art with regard to the present disclosure.

SUMMARY

To address the above-discussed deficiencies, it is a primary object to provide, for use in an electronic device with a camera device, which prevents inflow of static electricity via the metallic decoration and leads the static electricity to a discharge module.

According to various embodiments of the present disclosure, in an electronic device with a camera device, the camera device comprises a camera housing where a camera assembly is mounted; a decoration part configured to cover the camera housing; and a fixing part provided along a periphery of the camera housing and configured to fix the decoration part, wherein the fixing part includes a path part along which static electricity introduced through the decoration part moves a discharge module mounted adjacent to the camera housing.

According to various embodiments of the present disclosure, an electronic device with a camera device comprises a main body part of the electronic device; a camera module provided inside the main body part; a rear case provided on a rear surface of the main body part and having a camera opening part exposing the camera module; a circuit board provided inside the main body part; and a conductive elastic part provided between the camera module and the circuit board and configured to discharge static electricity introduced through the camera module, wherein a path part is provided in the camera module and configured to connect the camera module with the conductive elastic part to contact each other.

According to various embodiments of the present disclosure, the camera device forms an inflow path along which static electricity introduced through the decoration part is allowed to flow to the discharge module, so that the static electricity is easily moved to the conductive module, increasing the discharge efficiency.

Further, the discharge efficiency is increased through the inflow path formed in the camera device, preventing the camera device from being damaged, broken, or malfunctioning by the static electricity.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

Throughout the drawings, like reference numerals will be understood to refer to like parts, components, and structures.

DETAILED DESCRIPTION

Figure 1:
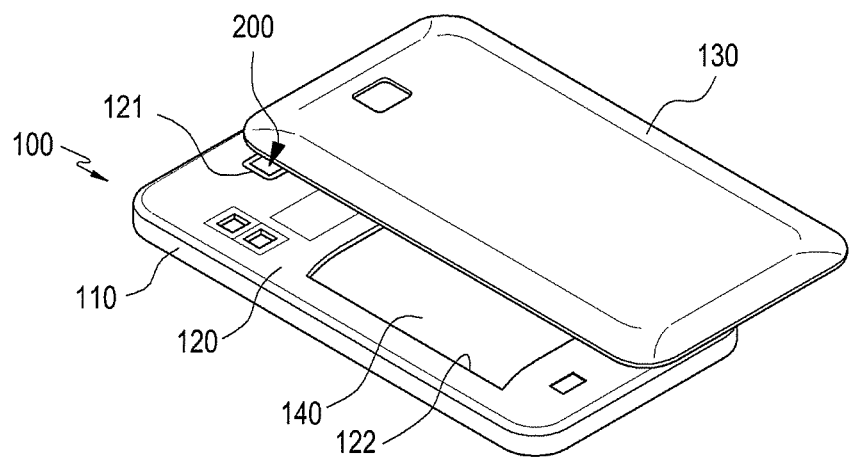
FIG. 1 illustrates the rear surface of an electronic device with a camera device according to various embodiments of the present disclosure.

FIGS. 1 through 8, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged wireless communication device. Hereinafter, embodiments of the present disclosure are described with reference to the accompanying drawings. Various changes can be made to the present disclosure, and the present disclosure comes with a diversity of embodiments. Some embodiments of the present disclosure are shown and described in connection with the drawings. However, it should be appreciated that the present disclosure is not limited to the embodiments, and all changes or equivalents or replacements thereto also belong to the scope of the present disclosure. The same or similar reference denotations are used to refer to the same or similar elements throughout the specification and the drawings.

The terms "comprise" or "comprising" as herein used specify the presence of disclosed functions, operations, or components, but do not preclude the presence or addition of one or more other functions, operations, or components. It will be further understood that the terms "comprise" and/or "have," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. For examples, "A or B" includes A, or includes B, or includes both A and B.

Ordinal numbers as herein used, such as "first," "second," etc., modify various components of various embodiments, but do not limit those components. For example, these terms do not limit the order and/or importance of the components. These terms are only used to distinguish one component from another. For example, a first user device and a second user device are different user devices from each other. For example, according to various embodiments of the present disclosure, a first component can denote a second component, and vice versa without departing from the scope of the present disclosure.

When a component is "connected to" or "coupled to" another component, the component is directly connected or coupled to the other component, or other component(s) intervene therebetween. In contrast, when a component is "directly connected to" or "directly coupled to" another component, no other intervening components intervene therebetween.

The terms as used herein are provided merely to describe some embodiments thereof, but not to limit the present disclosure. It is to be understood that the singular forms "a," "an," and "the" include plural references unless the context clearly dictates otherwise.

Unless otherwise defined, all terms including technical and scientific terms used herein have the same meaning as commonly understood by one of ordinary skill in the art to which the embodiments of the present disclosure belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

According to various embodiments of the present disclosure, an electronic device as disclosed herein is a device with a communication function. For example, examples of the electronic device includes, but is not limited to, a smartphone, a tablet PC, a mobile phone, a video phone, an e-book reader, a desktop PC (personal computer), a laptop computer, a netbook computer, a PDA (personal digital assistant), a PMP (portable multimedia player), an MP3 player, a mobile medical device, a camera, or a wearable device (such as a head-mounted device (HMD), electronic clothes, an electronic bracelet, an electronic necklace, an electronic appcessory, an electronic tattoo, or a smart watch).

According to various embodiments of the present disclosure, the electronic device is a smart home appliance with a communication function. For example, examples of the smart home appliance include, but is not limited to, a television, a digital video disk (DVD) player, an audio player, a refrigerator, an air conditioner, a vacuum cleaner, an oven, a microwave oven, a washer, a drier, an air cleaner, a set-top box, a TV box (such as SAMSUNG HOMESYNC, APPLE TV, or GOOGLE TV), a gaming console, an electronic dictionary, a camcorder, or an electronic picture frame.

According to various embodiments of the present disclosure, examples of the electronic device includes, but is not limited to, various medical devices (such as magnetic resource angiography (MRA) device, a magnetic resource imaging (MRI) device, a computed tomography (CT) device, an imaging device, or an ultrasonic device), a navigation device, a global positioning system (GPS) receiver, an event data recorder (EDR), a flight data recorder (FDR), an automotive infotainment device, an sailing electronic device (such as a sailing navigation device, a gyroscope, or a compass), avionics, or security devices.

According to various embodiments of the disclosure, examples of the electronic device include, but is not limited to, a piece of furniture with a communication function, part of a building or structure, an electronic board, an electronic signature receiving device, a projector, or various measurement devices (such as devices for measuring water, electricity, gas, or electromagnetic waves). According to various embodiments of the present disclosure, the electronic device is one or a combination of the above-listed devices or appliances. According to various embodiments of the present disclosure, the electronic device is a flexible device. According to various embodiments of the present disclosure, the electronic device is not limited to the above-listed devices or appliances.

According to various embodiments of the present disclosure, an electronic device with a camera device be a smartphone, a mobile phone, a navigation device, a game player, a TV, a head unit for automobile, a laptop computer, a tablet computer, a personal media player (PMP), as described above, or a personal digital assistant (PDA), and be implemented as a pocket-sized portable communication terminal with wireless communication capability. According to various embodiments of the present disclosure, the electronic device is a flexible device or a flexible display.

Hereinafter, an electronic device 100 with a camera device according to various embodiments is described with reference to FIGS. 1 to 5. Hereinafter, the term "user" as used herein denotes a person or device (such as an artificial intelligent electronic device 100) using the electronic device 100.

Hereinafter, two of various embodiments of a camera device and an electronic device 100 with the same are described. However, each embodiment described below is a mere one of various embodiments of a camera device and an electronic device 100 with the same, and various changes or modifications are made thereto depending on the stacked state or shape of the camera device or the stacked state, structure, or shape of the electronic device 100, or other various conditions.

Figure 2:
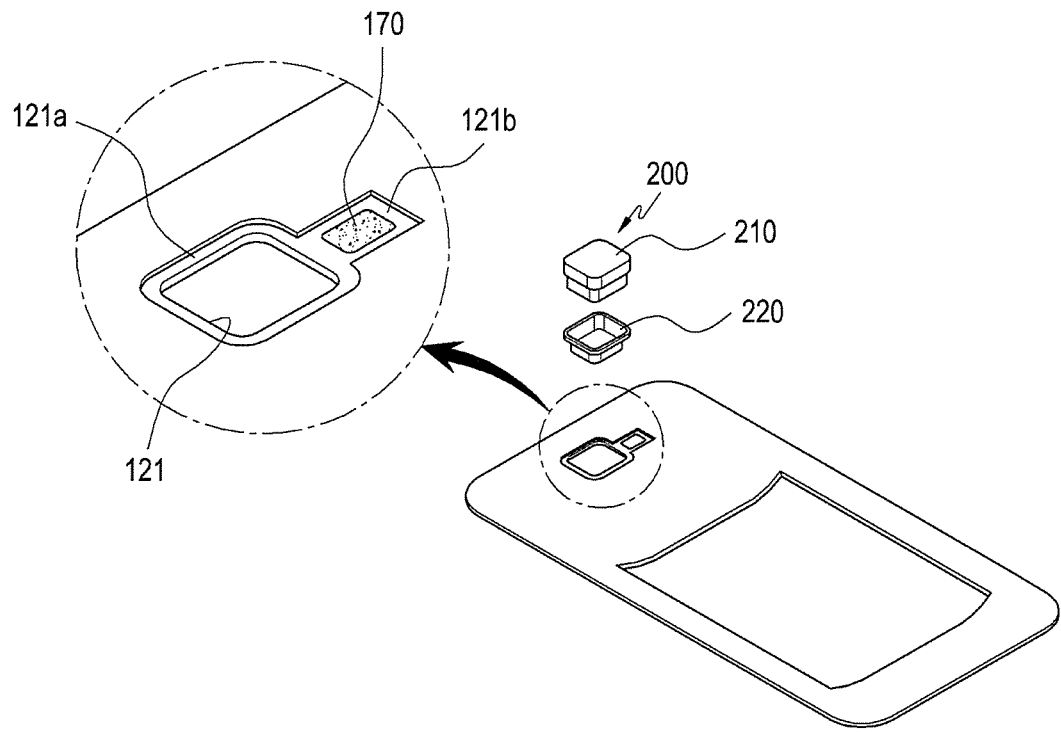
FIG. 2 is a view illustrating a rear case and a camera module separated from the rear case in an electronic device with a camera device, according to various embodiments of the present disclosure.
Figure 3:
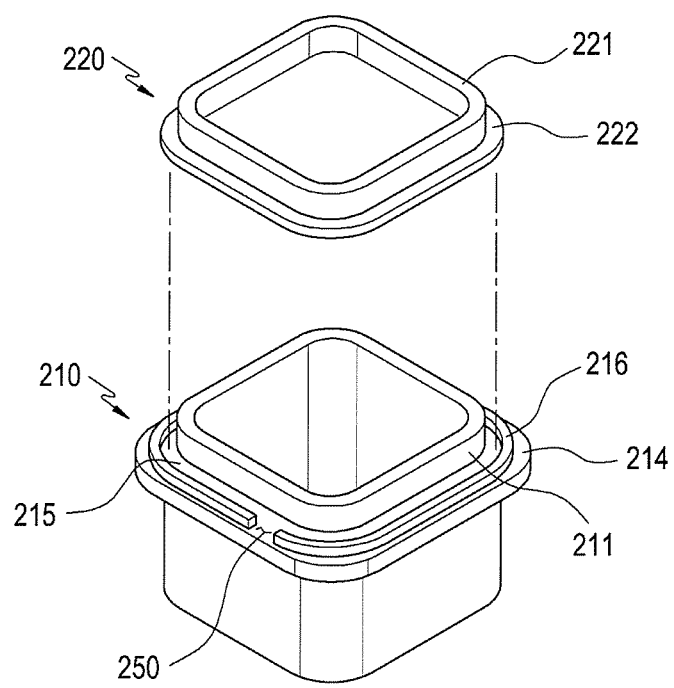
FIG. 3 illustrates a camera module in an electronic device with a camera device according to various embodiments of the present disclosure.

FIG. 1 illustrates the rear surface of an electronic device with a camera device according to various embodiments of the present disclosure. FIG. 2 illustrates a rear case and a camera module separated from the rear case in an electronic device with a camera device, according to various embodiments of the present disclosure. FIG. 3 illustrates a camera module in an electronic device with a camera device according to various embodiments of the present disclosure.

Referring to FIGS. 1 to 3, according to various embodiments of the present disclosure, an electronic device 100 with a camera device includes a main body part 110, a camera module 200, a rear case 120, and a discharge module 170. The camera module 200 includes a camera assembly (not shown), a camera housing 210, a decoration part 220, a fixing part, and a discharge path part 250.

The main body part 110 includes various shapes depending on the shape of the electronic device 100. Inside the main body part 110 is provided a circuit board 190 on which various modules are mounted to perform various functions.

A rear case 120 covering the rear surface of the main body part 110 is coupled at the rear surface of the main body part 110. The rear case 120 includes an accommodation space 122 for accommodating a battery 140. A cover part 130 is provided on the rear surface of the main body part 110 to cover the rear case 120. The cover part 130 is detachably coupled with the main body part 110. A camera opening part 121 is provided on a surface of the rear case 120 so that the top surface of a camera module 200 mounted in an inside of the main body part 110, to be described below, is exposed to the surface of the rear case 120. A lead hole 121a is formed around the camera opening part 121 in an inside surface of the rear case 120 to allow the top surface of the camera module 200, which is to be described below, to be seated. Further, an extension hole 121b is formed at a side of the lead hole 121a to extend from the lead hole 121a, and a discharge module 170 is mounted in the extension hole 121b to discharge static electricity introduceable through the camera module 200 to the ground part of the circuit board 190. The discharge module 170 is formed of a conductive tape.

According to various embodiments of the present disclosure, reference numeral '190' denotes the circuit board 190, but this exemplifies an electronic device 100 with a ground implemented through a circuit board 190. Accordingly, reference numeral '190' denotes any structure that allows introduced static electricity to be discharged, i.e., a ground member (hereinafter, referred to as a 'circuit board 190'), such as a circuit board, a bracket, or a groundable plate.

The discharge module 170 is spaced apart at a predetermined interval from the camera module 200 mounted in the camera opening part 121. An air gap to the discharge path part 250, 251, and 252 is formed between a bottom surface part 222 of the decoration part 220, covering the outside of the camera module 200, and the discharge module 170, so that static electricity introduced to the camera module 200 is delivered to the discharge module 170 through the discharge path part 250.

A conductive member 180 is further provided between the discharge module 170 and the circuit board 190 to deliver static electricity. The conductive member 180 electrically connects the discharge module 170 with the circuit board 190 provided in the main body part 110 to ground the static electricity introduced to the discharge module 170 to the side of the circuit board 190. The conductive member 180 is formed of a conductive elastomer including an SMD gasket.

Figure 4:
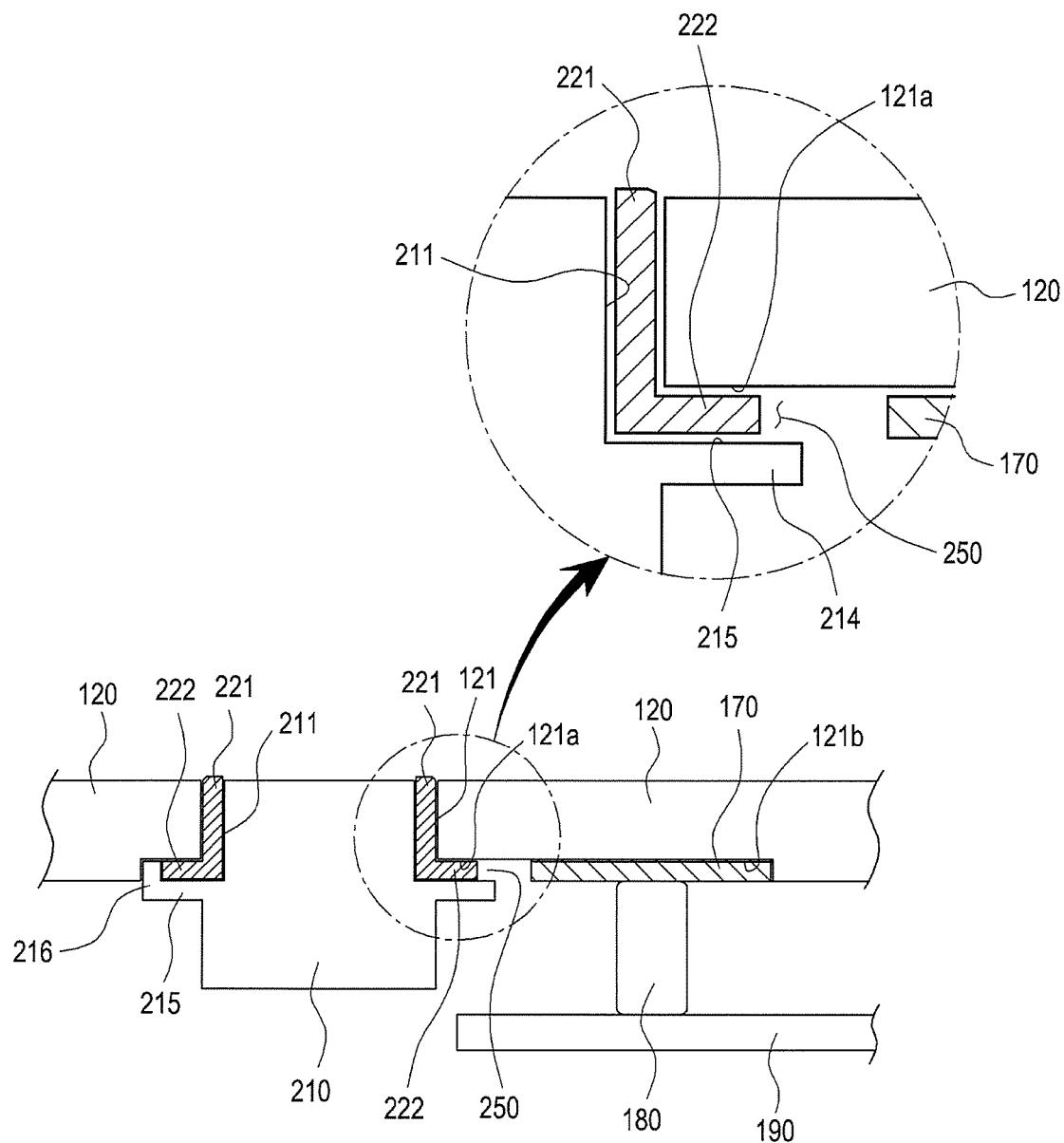
FIG. 4 illustrates an electronic device with a camera device according to various embodiments of the present disclosure.

FIG. 4 illustrates an electronic device with a camera device according to various embodiments of the present disclosure.

Referring to FIG. 4, according to various embodiments of the present disclosure, the camera module 200 includes a camera assembly, a camera housing 210 (hereinafter, referred to as a 'housing 210'), a decoration part 220, a fixing part, and a discharge path part 250, 251, and 252.

The camera assembly includes at least one or more stacking lens modules, an imaging module, and a flexible circuit board 190, and further includes a driver for auto-focusing or image-correcting the camera lens module.

The housing 210 is configured to accommodate the camera assembly and is mounted to electrically connect to the circuit board 190 in the inside of the main body part 110 of the electronic device 100 as is to be described below. The housing 210 is formed of an injection-molded article. A decoration mounting surface 211 covered by the decoration part 220 as the decoration part 220 is inserted therein, to be described below, and a fixing part that fixes the decoration part 220 is formed on an outside surface at an upper side part of the housing 210. The upper part of the housing 210 where the decoration part 220 is mounted is seated in the camera opening part 121 of the electronic device 100 to be described below and the decoration part 220 be shaped to surround the housing 210.

The fixing part includes a seating plate 214 where the decoration part 220, specifically, the bottom surface part 222 of the decoration part 220 is placed, and a fixing protrusion 216 that projects in a light axial direction (O) from the seating plate 214 around the edge of the seating plate 214. The seating plate 214 is projected externally (in a direction perpendicular to the light axial direction (O) according to the present disclosure) along the periphery of an end part of the outside surface of the decoration mounting surface 211, allowing the decoration part 220 to be placed thereon. The fixing protrusion 216 is a structure projecting from the seating plate 214 in the light axial direction (O) and is spaced apart at a predetermined interval from an end of the mounted surface to allow the bottom surface part 222 of the decoration part 220 to be inserted and seated in an inner space of the fixing protrusion 216 (hereinafter, referred to as a "seating hole 215").

The decoration part 220 includes a body part 221 and the bottom surface part 222. The body part 221 is formed to penetrate the inside, like in the shape of a doughnut, and the housing 210, specifically, the decoration mounted surface 211, is inserted into the inside of the body part 221. The body part 221 is mounted on an upper periphery surface of the housing 210. The bottom surface part 222 is a component that is provided at an end part of a lower part of the body part 221 and is projected externally from the body part 221 to be inserted and fixed in the seating hole 215. Although not shown, a separate coupling member, such as a double-sided tape, is further included between the bottom surface part 222 and the seating hole 215. When the decoration part 220 is coupled to the housing 210, the periphery surface of an upper part of the housing 210 is covered by the body part 221, and the bottom surface part 222 is inserted into the seating hole 215, leaving the decoration part 220 to be fixed to the housing 210. The decoration part 220 is formed of a metallic material.

The discharge path part 250, 251, and 252 is formed in the fixing part, specifically, the fixing protrusion 216, to guide static electricity introduced through the decoration part 220 in the fixing part to the discharge module 170 positioned adjacent to the housing 210. The discharge path part 250, 251, and 252 is an opening formed at a predetermined position of the fixing protrusion 216 and is formed to penetrate the fixing protrusion 216 between the inside and outside thereof.

According to various embodiments of the present disclosure, the term "opening" means that the fixing protrusion 216 is partially disconnected, i.e., removed at a predetermined position to be opened, to have an open hall shape, for example. In certain embodiments, the shape of the opening is not limited thereto. For example, the opening is provided in such a state that the fixing protrusion 216 is bored but not removed (in the shape of a through hole 251 shown in FIG. 6). Further, the opening is formed to penetrate the seating plate 214 depending on the position where the discharge module 170 is mounted (refer to FIG. 7). As such, the opening includes any modifications or variations in the shape, structure, or configuration thereof as long as the bottom surface part 222 of the decoration part 220 and the discharge module 170 are shaped to be positioned to neighbor each other by the air gap of the opening, and any other modifications or changes be made to the position or structure in which the opening is formed depending on the position where the discharge module 170 is mounted.

Figure 5:
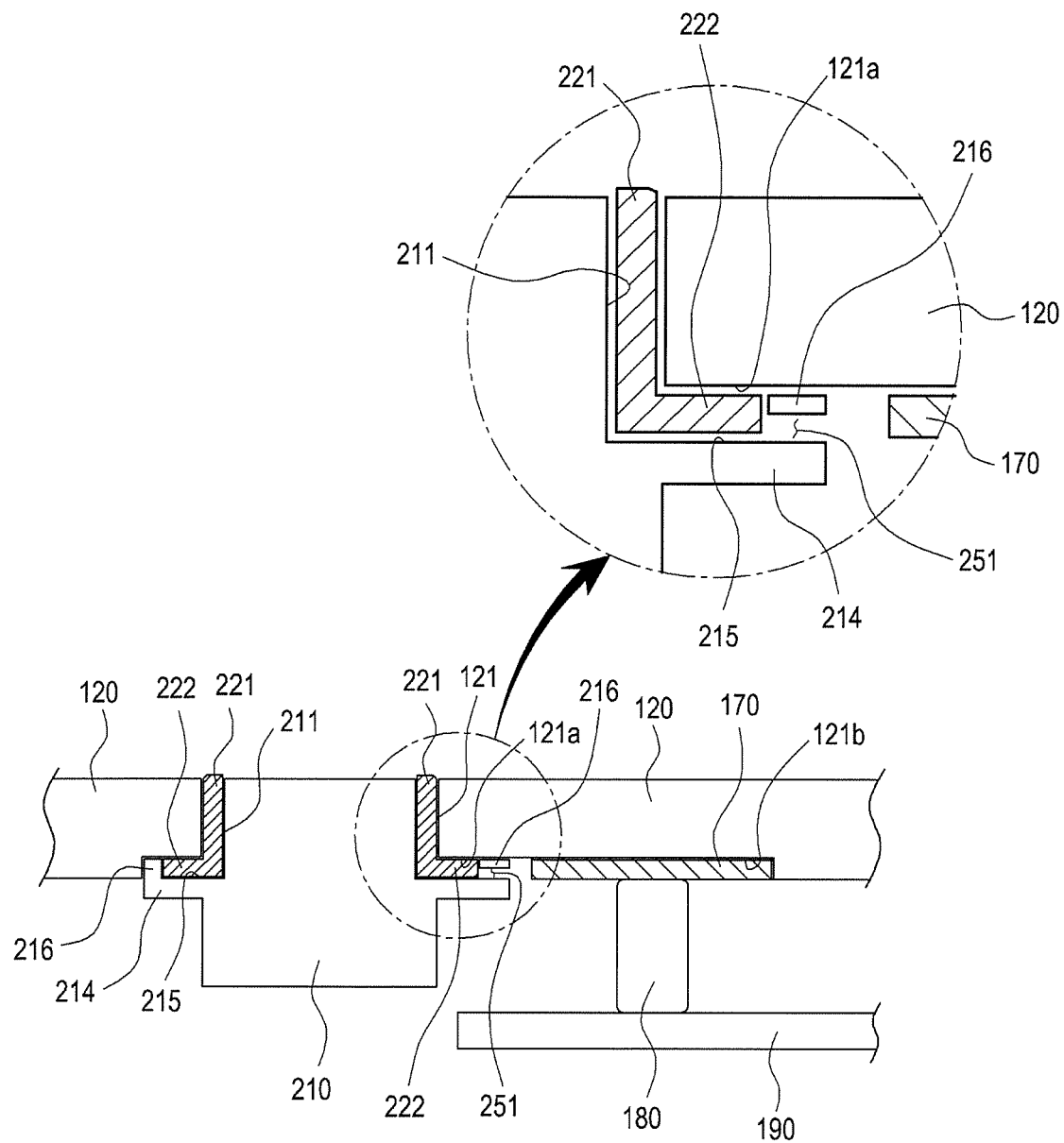
FIG. 5 illustrates another shape of a path part in an electronic device with a camera device according to various embodiments of the present disclosure.

FIG. 5 illustrates another shape of a path part in an electronic device with a camera device according to various embodiments of the present disclosure.

Referring to FIG. 5, the discharge path part 251 according to the present disclosure differs in shape from the discharge path part according to the above embodiment. According to various embodiments of the present disclosure, the discharge path part 251 is formed of a through hole penetrating the fixing protrusion 216 inside-to-outside at a predetermined position of the fixing protrusion 216. Accordingly, the bottom surface part 222 of the decoration part 220 is engaged to the fixing protrusion 216, and the bottom surface part 222 positioned in the through hole at the predetermined position is positioned to neighbor the discharge module 170 through the air gap of the through hole.

Figure 6:
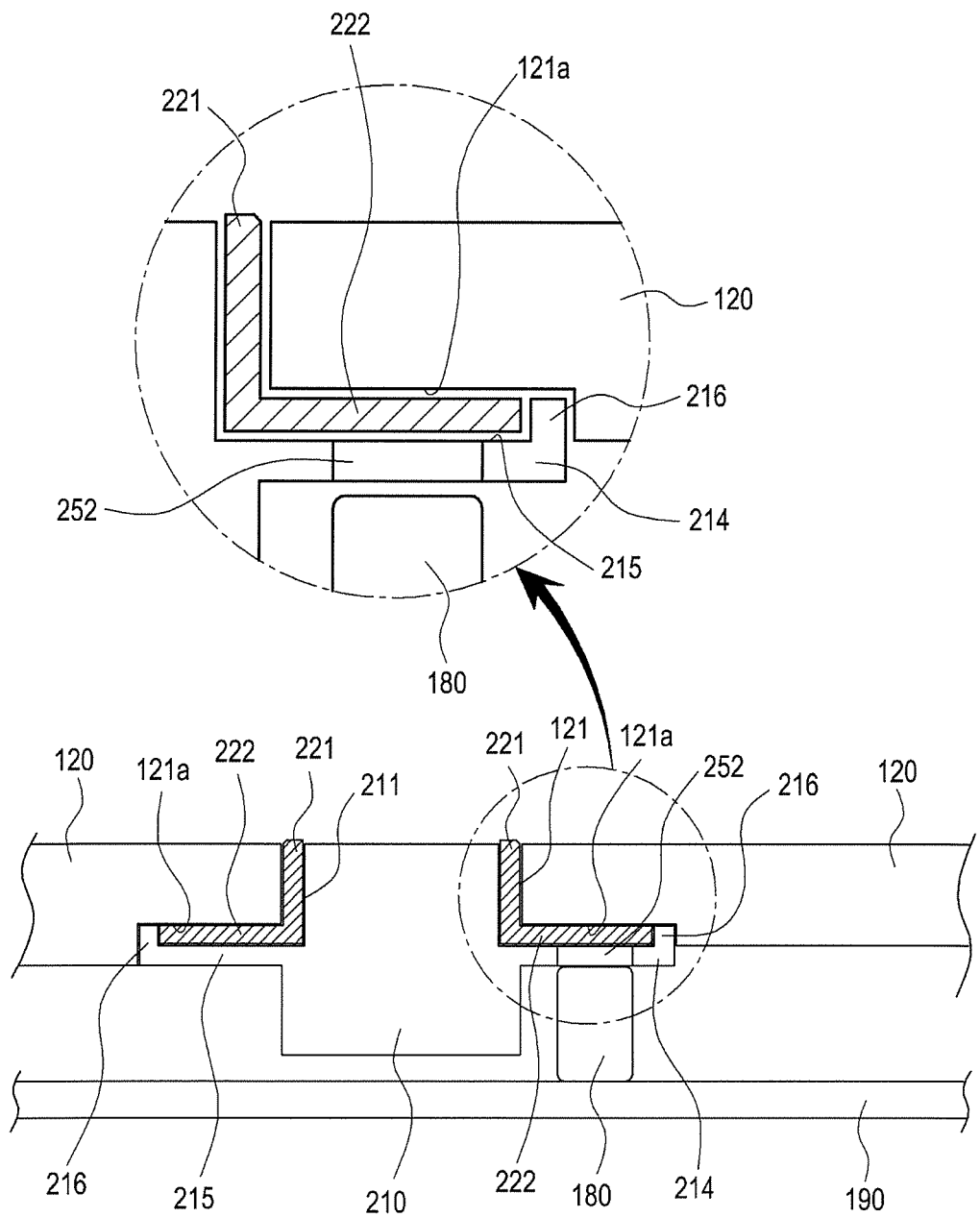
FIG. 6 illustrates another shape of a path part in an electronic device with a camera device according to various embodiments of the present disclosure.

FIG. 6 illustrates another shape of a path part in an electronic device with a camera device according to various embodiments of the present disclosure.

Referring to FIG. 6, the discharge path part 252 according to the present disclosure includes a different shape and structure than those according to the above two embodiments. The discharge path part 252 according to the present disclosure be formed of an opening (hereinafter, referred to as a 'second through hole') penetrating the seating plate 214, specifically, the seating hole 215, top-to-bottom.

Although in the above two embodiments the discharge module 170 is positioned to neighbor the fixing protrusion 216, the discharge module 170, according to certain embodiments of the present disclosure, is positioned on a lower surface of the seating plate 214 or adjacent to a lower surface side of the seating plate 214. Accordingly, when the bottom surface part 222 of the decoration part 220 is placed in the seating hole 215, the bottom surface part 222 of the decoration part 220 and the discharge module 170 is positioned adjacent to neighbor each other through the air gap of the second through hole.

The discharge path part 250, 251, and 252 is formed at a positioned of the fixing protrusion 216 adjacent to the discharge module 170 (refer to FIGS. 4, 5, and 6—hereinafter, it apply commonly to the three embodiments). Accordingly, the bottom surface part 222 of the decoration part 220 is positioned adjacent to neighbor the discharge module 170. Static electricity created outside the camera module 200 is introduced through the metallic decoration part 220, and jumps and moves to the discharge module 170 neighboring the bottom surface part 222. In particular, since only an opening, i.e., the air gap with a predetermined interval, is formed between the bottom surface part 222 and the discharge module 170, static electricity easily jumps to the discharge module 170.

The housing 210 with the decoration part 220, provided as above, is mounted in the inside of the main body part 110, and the decoration part 220 covering the top surface and periphery of the camera housing 210 is exposed in the camera opening of the rear case 120, forming a surface similar to the rear case 120.

When the decoration part 220 is inserted into the housing 210, the body part 221 covers the upper periphery surface of the housing 210 (the decoration mounting surface 211), and the bottom surface part 222 is seated in the seating hole 215 inside the fixing protrusion 216. When the bottom surface part 222 is inserted into the seating hole 215, an end part of the bottom surface part 222 is engaged to the inside surface of the fixing protrusion 216. At the position where the opening is formed, the bottom surface part 222 is configured to be exposed to the outside of the fixing protrusion 216 through the opening.

When the decoration part 220-mounted housing 210 is mounted in the main body part 110 and the rear case 120 is coupled to the main body part 110 at a rear surface thereof, a portion of the top surface of the decoration part 220-mounted housing 210 is inserted into the lead hole 121*a*. The rest of the housing 210 is positioned in the camera opening part 121 and exposed to the outer surface of the rear case 120. While the camera module 200 is mounted at the above-described position, the bottom surface part 222 positioned in the opening is positioned neighboring the discharge module 170 through the air gap of the opening.

When static electricity is created outside the electronic device 100 thusly assembled and introduced into the decoration part 220, the rest of the fixing protrusion 216, except the opening, is closed by the fixing protrusion 216, thus rendering it difficult for static electricity to be discharged. Since the bottom surface part 222 and the discharge module 170 neighbor each other with the air gap of the opening therebetween, the static electricity is discharged through the opening to the discharge module 170. The static electricity discharged to the discharge module 170 is led to the circuit board 190 through the conductive member 180 and grounded. The provision of the discharge path part 250, 251, and 252 allowing static electricity introduceable to the metallic decoration part 220 to be delivered from the decoration part 220 to the discharge module 170 enhances discharge efficiency and leaves the camera module 200 or other modules in the main body part 110 in a safe state staying away from any errors, such as damage or malfunctions due to static electricity.

Figure 7:
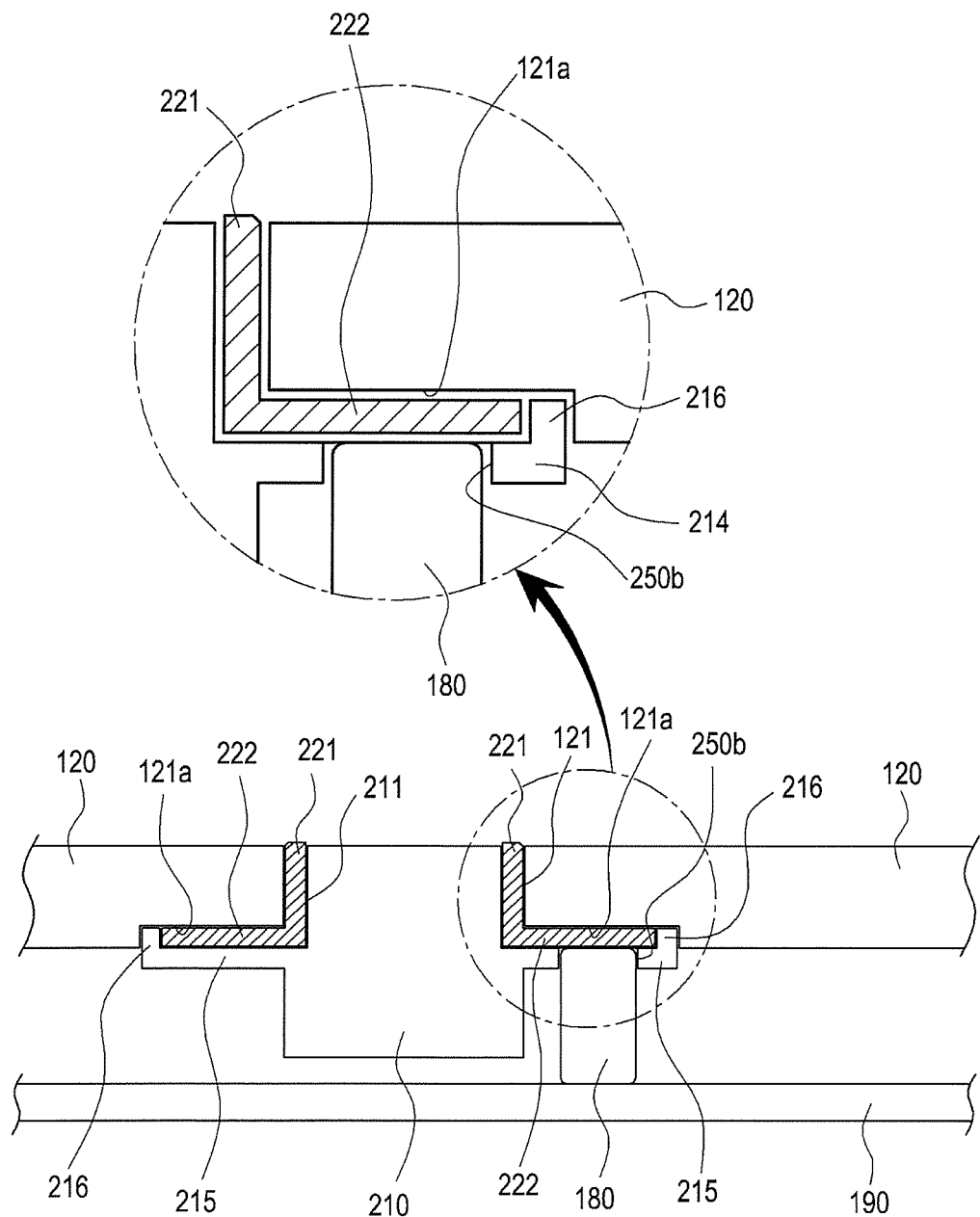
FIG. 7 illustrates an electronic device with a camera device according to various embodiments of the present disclosure.
Figure 8:
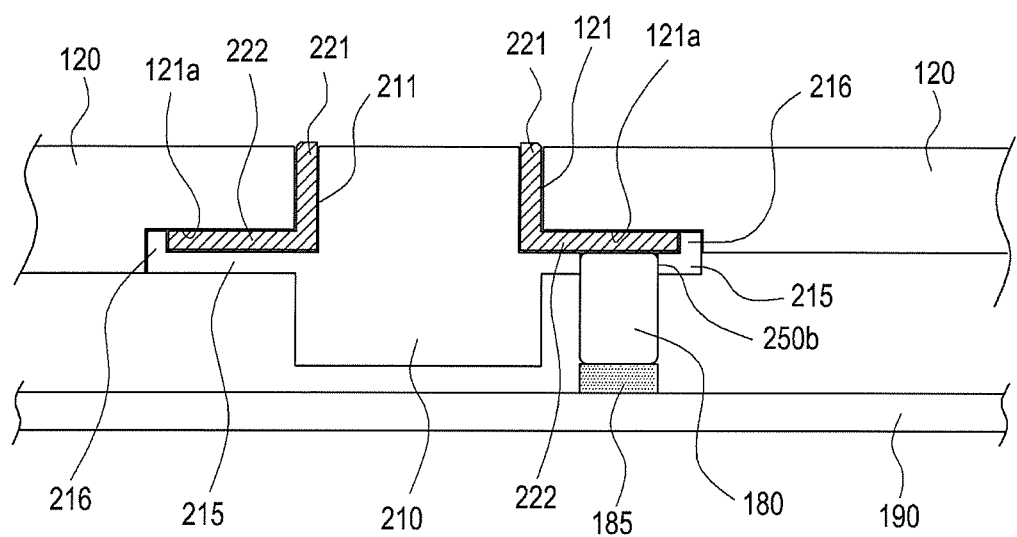
FIG. 8 illustrates a cap part between a conductive member and a ground member in an electronic device with a camera device according to various embodiments of the present disclosure.

Now described are a camera device and an electronic device 100 with the same with reference to FIGS. 7 and 8, according to various embodiments of the present disclosure. According to various embodiments of the present disclosure, a camera device and an electronic device 100 including the camera device have a discharge path part 250 that allows static electricity introduced to the decoration part 220 to be discharged to the discharge module 170. According to various embodiments of the present disclosure, a camera device and an electronic device 100 with the same are configured with a discharge path part 250b to allow static electricity introduced to the decoration part 220 to be immediately discharged through the conductive member 180 to the circuit board 190.

FIG. 7 illustrates an electronic device with a camera device according to various embodiments of the present disclosure. FIG. 8 illustrates a cap part between a conductive member and a ground member in an electronic device with a camera device according to various embodiments of the present disclosure.

Referring to FIGS. 7 and 8, according to various embodiments of the present disclosure, a camera device and an electronic device 100 with the same, similar to the above-described camera device and electronic device 100 with the same, include a main body part 110, a camera module 200, a rear case 120, and a discharge module 170. The camera module 200 includes a camera assembly, a camera housing 210, a decoration part 220, and a fixing part. According to various embodiments of the present disclosure, the camera module 200 includes a discharge path part 250b that moves static electricity introduced to the decoration part 220.

As described above, the rear case 120 according to the instant embodiment does not have the discharge module 170 mounted in the electronic device 100 with a camera device according to the above-described embodiment. Further, the decoration part 220 is provided to directly contact the conductive member 180 through the discharge path part 250b so that static electricity introduced to the decoration part 220 is delivered directly to the conductive member 180.

Specifically, the camera module 200 includes the decoration part 220, and the housing 210 includes a decoration mounting surface 211 covered by the decoration part 220 as the decoration part 220 is inserted therein and a seating fixing part that externally projects from the decoration mounting surface 211 to fix the decoration part 220.

The seating fixing part includes a seating plate 214 and a fixing protrusion 216. The seating plate 214 is formed in a plate shape that is externally projected from the decoration mounting surface 211 so that the bottom surface part 222 of the decoration part 220 is placed thereon.

The fixing protrusion 216 is a component projected in a light-axial direction (O) from on the seating plate 214 so that, when the bottom surface part 222 is placed on the seating plate 214, the periphery of the bottom surface part 222 is engaged thereto. The seating plate 214 between the decoration mounting surface 211 and the fixing protrusion 216 is formed in the shape of a seating hole 215 where the bottom surface part 222 is inserted.

The discharge path part 250b is provided to penetrate the seating hole 215 top-to-bottom at a predetermined position of the seating hole 215. The discharge path part 250b is provided such that an end part of the conductive member 180 mounted to be electrically connected to the circuit board 190 is led therein.

With the housing 210 and the decoration part 220 assembled together, the body part 221 of the decoration part 220 is inserted into the decoration mounting surface 211 of the housing 210, and the bottom surface part 222 of the decoration part 220 is placed and inserted into the seating hole 215 in the fixing protrusion 216.

End parts of the bottom surface part 222 are surrounded by the fixing protrusion 216 and is prevented from flowing and fixed. Since a discharge opening 250b is provided at a predetermined position of the seating hole 215, the bottom of the bottom surface part 222 is exposed through the discharge opening 250b of the seating hole 215. The conductive member 180 mounted on the circuit board 190 leads into the discharge opening 250b and is mounted contacting the bottom surface part 222 of the decoration part 220.

Although an end of the conductive member 180 is led to the discharge path part 250b and the other end thereof is positioned at the ground part, the conductive member 180 is rendered to flow as the electronic device 100 is carried. When the conductive member 180 flows, the conductive member 180 is spaced apart from the ground part of the circuit board 190. To prevent the conductive member 180 from escaping from the ground part due to the flow of the conductive part or keeping it positioned neighboring the ground part, a cap part 185 is provided at the other end of the conductive member 180 and the circuit board 190. According to various embodiments of the present disclosure, the cap part 185 is formed of a groundable material or an air gap.

In the camera device assembled in the electronic device 100 as described above, if static electricity is created outside the electronic device 100, the static electricity flow in the camera module 200, specifically, the decoration part 220. The static electricity introduced into the decoration part 220 is discharged to the conductive member 180 through the bottom surface part 222 positioned on the side of the discharge opening 250b, and the static electricity moved to the conductive member 180 is grounded through the circuit board 190.

Although the present disclosure has been described with an exemplary embodiment, various changes and modifications may be suggested to one skilled in the art. It is intended that the present disclosure encompass such changes and modifications as fall within the scope of the appended claims.

What is claimed is:

1. A camera device, comprising:
   a camera housing comprising a camera assembly;

a cover part configured to cover the camera housing; and
a discharge module spaced apart from the cover part such that static electricity, introduced through the cover part, is allowed to flow to the discharge module via an empty space between the discharge module and the cover part.

2. The camera device of claim 1, further comprising a fixing part provided along a periphery of the camera housing and configured to fix the cover part, wherein the fixing part includes a path part along which static electricity introduced through the cover part moves to the discharge module mounted adjacent to the camera housing, and wherein the fixing part includes:
a seating plate configured to project from an outside surface of the camera housing, the cover part placed on the seating plate; and
a fixing protrusion configured to project from the seating plate and spaced apart at a predetermined interval from a periphery surface of the camera housing, wherein the path part is provide on the fixing protrusion adjacent to the discharge module.

3. The camera device of claim 2, wherein the path part is formed of an opening configured to penetrate the fixing protrusion inside-to-outside, and wherein an end part of a bottom surface of the cover part and the discharge module are provided adjacent to neighbor each other through the opening.

4. The camera device of claim 3, wherein the opening is shaped as one of an open hole where a predetermined position of the fixing protrusion is removed or a through hole where a predetermined position of the fixing protrusion is penetrated.

5. The camera device of claim 2, wherein the path part is formed of an opening penetrating the seating plate top-to-bottom, and wherein the discharge module is positioned at a lower part of the seating plate where the opening is positioned so that a bottom surface of the cover part and the discharge module are provided adjacent to neighbor each other through the opening.

6. A camera device, comprising:
a camera housing comprising a camera assembly;
a cover part configured to cover the camera housing; and
a conductive member spaced apart from the cover part such that static electricity, introduced through the cover part, is allowed to flow to the conductive member via an empty space between the conductive member and the cover part.

7. The camera device of claim 6, further comprising a seating fixing part provided along a periphery of the camera housing, the cover part placed on the seating fixing part, wherein the seating fixing part includes a path part, and
the conductive member provided at an outside of the camera housing is led in the path part, and the conductive member and the cover part placed on the seating fixing part are configured to contact each other at the path part,
wherein the path part is formed of an opening configured to penetrate the seating fixing part top-to-bottom.

8. The camera device of claim 7, wherein the cover part includes a body part configured to cover a periphery part of the camera housing and a bottom surface part configured to project along a periphery of an end of the body part and placed on the seating fixing part.

9. The camera device of claim 8, wherein the seating fixing part includes a seating plate on which the bottom surface part is seated and a fixing protrusion configured to project from on the seating plate and fix the bottom surface part, wherein a discharge opening is formed in the seating plate configured to penetrate the seating plate top-to-bottom.

10. The camera device of claim 6, wherein the conductive member is formed of a conductive elastomer including a gasket for a surface mount device (SMD).

11. An electronic device with a camera device, comprising:
a main body part of the electronic device;
a camera module provided inside the main body part;
a rear case provided on a rear surface of the main body part and includes a camera opening part configured to expose the camera module; and
a discharge module mounted adjacent to a periphery of the camera opening part inside the rear case, wherein the discharge module is spaced apart from a cover part such that static electricity, introduced through the cover part, is allowed to flow to the discharge module via an empty space between the discharge module and the cover part.

12. The electronic device of claim 11, further comprising a path part provided in the camera module and configured to allow static electricity to move from an end part of the camera module to the discharge module, and
wherein the camera module includes a housing where a camera assembly is mounted and a cover part configured to cover a periphery of the housing.

13. The electronic device of claim 12, further comprising a fixing part provided along the periphery of the housing and configured to fix the cover part.

14. The electronic device of claim 13, wherein the fixing part includes:
a seating plate where the cover part is placed; and
a fixing protrusion configured to project from on the seating plate and spaced apart at a predetermined interval from a periphery surface of the housing, wherein the path part is provided on the fixing protrusion adjacent to the discharge module.

15. The electronic device of claim 14, wherein the path part is formed of an opening penetrating the fixing protrusion inside-to-outside, and wherein a bottom surface of the cover part and the discharge module are provided adjacent to neighbor each other through the opening.

16. The electronic device of claim 14, wherein the opening is shaped as one of an open hole where a predetermined position of the fixing protrusion is removed or a through hole where a predetermined position of the fixing protrusion is penetrated.

17. The electronic device of claim 14, wherein the path part is formed of an opening penetrating the seating plate top-to-bottom, and wherein the discharge module is positioned at a lower part of the seating plate where the opening is positioned so that a bottom surface of the cover part and the discharge module are provided adjacent to neighbor each other through the opening.

18. The electronic device of claim 12, wherein the housing includes an injection-molded article, and wherein the cover part includes a metallic member.

19. The electronic device of claim 11, wherein a ground member is provided inside the main body part to discharge static electricity, and wherein a gasket for a surface mount device (SMD) is further included between the discharge module and the ground member is configured to deliver the static electricity to the ground member.

20. An electronic device with a camera device, comprising:
a main body part of the electronic device;
a camera module provided inside the main body part;

a rear case provided on a rear surface of the main body part and includes a camera opening part configured to expose the camera module;
a circuit board provided inside the main body part; and
a conductive elastic part provided between the camera module and the circuit board and configured to discharge static electricity introduced through the camera module, wherein a path part is provided in the camera module to connect the camera module with the conductive elastic part to contact each other.

21. The electronic device of claim 20, wherein the path part is formed of an opening configured to penetrate a seating fixing part top-to-bottom.

22. The electronic device of claim 21, wherein the camera module includes a housing where a camera assembly is mounted and a cover part is configured to cover a periphery of the housing, wherein the seating fixing part is provided around the periphery of the housing, the cover part placed and fixed on the seating fixing part.

23. The electronic device of claim 22, wherein the cover part includes a body part configured to cover a periphery part of the camera housing and a bottom surface part configured to project along a periphery of an end of the body part and placed and fixed on the seating fixing part.

24. The electronic device of claim 23 wherein the seating fixing part includes a seating plate on which the bottom surface part is seated and a fixing protrusion configured to project from on the seating plate and fix the bottom surface part, wherein a discharge opening is provided in the seating plate is configured to penetrate the seating plate top-to-bottom.

25. The electronic device of claim 22, wherein the housing is formed of an injection-molded article, and wherein the cover part includes a metallic member.

26. The electronic device of claim 20, wherein the conductive elastic part is formed of a conductive elastomer including a gasket for a surface mount device (SMD).

27. The electronic device of claim 20, further comprising a cap part between the conductive elastic part and the circuit board.

* * * * *